United States Patent [19]

Schouhamer Immink

[11] Patent Number: 5,760,718

[45] Date of Patent: Jun. 2, 1998

[54] ENCODING ARRANGEMENT FOR ENCODING A SEQUENCE OF (N-1)-BIT INFORMATION WORDS INTO A SEQUENCE OF N-BIT CHANNEL WORDS, AND A DECIDING ARRANGEMENT FOR DECODING A SEQUENCE OF N-BIT CHANNEL WORDS IN A SEQUENCE OF (N-1)-BIT INFORMATION WORDS

[75] Inventor: Kornelis A. Schouhamer Immink, Eindhoven, Netherlands

[73] Assignee: U.S. Philips Corporation, New York, N.Y.

[21] Appl. No.: 599,527

[22] Filed: Feb. 2, 1996

[30] Foreign Application Priority Data

Feb. 3, 1995 [EP] European Pat. Off. ............ 95200261

[51] Int. Cl.$^6$ ............................................ H03M 7/00
[52] U.S. Cl. ............................................ 341/80; 341/95
[58] Field of Search ............................ 341/59, 80, 95

[56] References Cited

U.S. PATENT DOCUMENTS

| | | | |
|---|---|---|---|
| 4,159,529 | 6/1979 | Stakhov | 341/80 |
| 4,187,500 | 2/1980 | Stakhov et al. | 341/80 |
| 4,792,793 | 12/1988 | Rawlinson et al. | 341/89 |
| 4,818,969 | 4/1989 | Krakauer et al. | 341/80 |

OTHER PUBLICATIONS

"Fibonacci Codes for Synchronization Control" by William H. Kautz, Trans. IEEE, IT-11, Apr. 1965, pp. 284–291.

*Primary Examiner*—Marc S. Hoff
*Attorney, Agent, or Firm*—Michael E. Belk

[57] ABSTRACT

Encoding arrangement for encoding a sequence of $(n-1)$bit information words into a sequence of n-bit channel words, and a decoding arrangement for decoding a sequence of n-bit channel words into a sequence of $(n-1)$-bit information words. The encoding arrangement comprises input means for receiving the information words, converter means for converting the $(n-1)$-bit information words into n-bit channel words and output means for supplying the channel words. The converter means comprises weight vector coefficient supply means for supplying a weight vector w, the weight vector having n weight vector coefficients $w_i$, where i is an integer running from 1 to n and the weight vector coefficients being in the form of $(n-1)$-bit binary words, and calculation means for carrying out a calculation using an information word so as to obtain a channel word. The weight vector coefficient supply means is adapted to supply only p bits of a weight vector coefficient $w_i$, the remaining $n-1-p$ bits of the $(n-1)$-bit weight vector coefficient word being 'zeroes' to be added before or after the p-bit binary word or before and after the p-bit binary word so as to obtain said weight vector coefficient, and that p is an integer smaller than $n-1$.

20 Claims, 1 Drawing Sheet

ENCODING ARRANGEMENT FOR ENCODING A SEQUENCE OF (N-1)-BIT INFORMATION WORDS INTO A SEQUENCE OF N-BIT CHANNEL WORDS, AND A DECIDING ARRANGEMENT FOR DECODING A SEQUENCE OF N-BIT CHANNEL WORDS IN A SEQUENCE OF (N-1)-BIT INFORMATION WORDS

BACKGROUND OF THE INVENTION

The invention relates to an encoding arrangement for encoding a sequence of (n-1)-bit information words into a sequence of n-bit channel words, the input means for receiving the information words, converter means for converting the (n-1)-bit information words into n-bit channel words, output means for supplying the channel words, the converter means comprising weight vector coefficient supply means for supplying a weight vector w, the weight vector having n weight vector coefficients $w_i$, where i is an integer running from 1 to n and the weight vector coefficients being in the form of (n-1)-bit binary words, calculation means for carrying out a calculation using an information word so as to obtain a channel word, which calculation is based on the following steps (a) set a running parameter j equal to n, (b) determine whether the value of the information word is larger than or equal to the weight vector coefficient $w_j$, if so, set the binary value in the bit position j of the channel word to 'zero' and subtract the value of the weight coefficient $w_j$ from the value of the information word so as to obtain a new value for the information word, if not, set the said binary value to 'one', (c) repeat the step (b) n-1 times for each next lower value for j, $w_n$ being the weight vector and to a decoding arrangement for decoding a sequence of n-bit channel words into a sequence of (n-1)-bit information words.

SUMMARY OF THE INVENTION

An encoding and decoding arrangement is described in the publication 'Fibonacci codes for synchronization control' by W. H. Kautz, in IFEE Trans. Inform. Theory, Vol. IT-11, pp. 284–292, 1965. The encoding method described in the publication can be used for obtaining a k-constrained sequence of channel words and is known under the name of 'enumerative encoding'. Enumerative decoding is done by forming the inner product of the received binary channel word and the weighting vector of n coefficients. The weighting vector is a function of the channel constraints in force and is usually precalculated. Note that multiplications are simple additions as the received channel word is binary.

Encoding is done by a method which is similar to decimal to binary conversion where, instead of the usual powers of two, the weighting vector of n coefficients is used. The binary representation of the weight coefficients in the Kautz method requires n-1bits. As there are n weight coefficients, a memory capacity of n(n-1) storage locations is required for storing the n coefficients. When encoding/decoding 100-bit channel words, a memory capacity of 9.9 K storage locations would be needed.

A second drawback of the prior art is that the additions in forming the inner product between the binary channel word and the vector of n coefficients requires a double carry, which complicates the structure of a parallel adder. This renders the conversion of the adder from a parallel to a simple serial form practically impossible.

These and other drawbacks are so serious that enumerative encoding and decoding have been confined to information theory practice.

The invention aims at providing a simplified encoding and decoding arrangement. The encoding and decoding arrangement are characterized in that the weight vector coefficient supply means is adapted to supply p bits of a weight vector coefficient $w_i$, the remaining n-1-p bits of the (n-1)-bit weight vector coefficient word being 'zeroes' to be added before or after the p-bit binary word or before and after the p-bit binary word so as to obtain said weight vector coefficient, and that p is an integer larger than one and smaller than n-1.

The invention is based on the recognition that it is possible to generate the n weight vector coefficients by generating for a weight vector coefficient a p-bit word and adding 'zeroes' before, or after the p-bit binary word, or both before and after the p-bit word so as to obtain the vector coefficient. By doing so, still a sufficient amount of coefficients are available to carry out the encoding. Further, if the weight vector coefficient generator means are adapted to generate a p-bit word for each of the n weight coefficients and if those n p-bit words are stored in the weight vector coefficient generator means, this means that a memory capacity of n*p memory locations are needed now, as the 'zeroes' to be added before and/or after the p-bit word so as to obtain the weight vector, need not be stored.

The encoding arrangement may be further characterized in that for generating a sequence of channel words having the virtue that at most k consecutive 'zeroes' occur between subsequent 'ones' in the sequence, the channel words further satisfying the requirement that at most r consecutive 'zeroes' occur at one and the same end of the channel words, the weighting coefficients $w_i$ satisfy the following equation:

$$w_i = \begin{cases} 2^{i-1}, & \text{for } i = 1, \ldots, r+1 \\ \sum_{j=i-1-k}^{i-1} w_j, & \text{for } i = r+2, \ldots, p, \\ 2^{i-p-1} * \text{FLOOR}\left(2^{p-i+1} * \sum_{j=i-1-k}^{i-1} w_j\right), & \text{for } i = p+1, \ldots, n, \end{cases}$$

where $w_j=0$ for $j \leq 0$, and where the FLOOR of a value equals the largest integer value which is smaller than said value, and where r is smaller than k.

This enables the generation of a sequence of channel signals that satisfy the k-constraint, even after concatenation of subsequent channel words. By specifying the value for r, r being smaller than k, it is automatically true that channel words are obtained having at most l 'zeroes' at the one end of the channel word, more specifically the leading end, of the channel word and at most r 'zeroes' at the other end, more specifically the trailing end, of the channel words, where l+r=k.

The encoding method is especially useful for high rate encodings, such as in a 196 to 197 conversion code.

These and other objects of the invention will be apparent from and further elucidated with reference to the embodiments described hereafter.

DETAILED DESCRIPTION OF THE PREFERRED EMBODIMENTS

Figure 1:
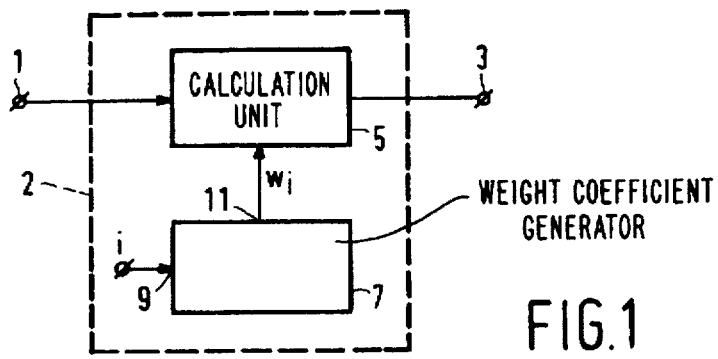
FIG. 1 is an embodiment of an encoding arrangement.

The description and explanation of the encoding and decoding arrangement in accordance with the invention starts with an explanation of the Kautz encoding and decoding method. Table 1 shows an example of a 4-to-5 encoding to clarify the operation.

TABLE 1

| decimal value | information word | channel word |
|---|---|---|
| 0 | 0000 | 11111 |
| 1 | 0001 | 11110 |
| 2 | 0010 | 11101 |
| 3 | 0011 | 11011 |
| 4 | 0100 | 11010 |
| 5 | 0101 | 11001 |
| 6 | 0110 | 10111 |
| 7 | 0111 | 10110 |
| 8 | 1000 | 10101 |
| 9 | 1001 | 10011 |
| 10 | 1010 | 10010 |
| 12 | 1100 | 01110 |
| 13 | 1101 | 01101 |
| 14 | 1110 | 01011 |
| 15 | 1111 | 01010 |

The table shows an encoding/decoding of 4-bit information words into 5-bit channel words. The resulting channel words satisfy the k=2 constraint, that at most two subsequent 'zeroes' are present between 'ones'.

The left hand column denotes the decimal representation of the information word and the middle column presents the binary representation of the information words. The right hand column displays the corresponding channel words. The channel words start and end with at most one 'zero', so that the k-constraint is also satisfied when concatenating subsequent channel words.

The decoding process is as follows. Define the weight vector $\{w\}$ for example as $\{11,6,3,2,1\}$. The weight vector is in the form of a number of (five) weight coefficients $w_i$, where i runs from 1 to 5. The weight coefficients are expressed in decimal notation for explanatory purposes, but it will be clear that actually, the weight coefficients are in 4-bit binary form.

The decoding arrangement forms the inner product $$I = \sum_{i=1}^{n} x_i * w_i$$

where $x_i$ is the i-th bit in the inverted channel word and I is the information word obtained from the calculation. It can be verified that for each channel word in the table the inner product so formed equals the integer representation I of the information word associated with the channel word as defined in the table. As an example, the channel word '01010' is decoded as =15, resulting in the information word '1111'. From this example, it is clear that the inner product simplifies to simple additions.

The encoding process translates the information words into the channel words in the following way. A calculation is carried out using an information word so as to obtain a channel word, which calculation is based on the following steps (a) set a running parameter j equal to n,
(b) determine whether the value of the information word is larger than or equal to the weight vector coefficient $w_j$, if so, set the binary value in the bit position j of the channel word to 'zero' and subtract the value of the weight coefficient $w_j$ from the value of the information word so as to obtain a new value for the information word, if not, set the said binary value to 'one',
(c) repeat the step (b) n−1 times for each next lower value for j, $w_n$ being the weight vector coefficient having the largest value and weight vector coefficients having a next lower subscript j having a smaller value.

In accordance with Kautz, the weight coefficients $w_i$ can be obtained using the following formula:

$$w_i = \begin{cases} 2^{i-1}, & \text{for } i = 1, \ldots, k+1 \\ \sum_{j=i-1-k}^{i-1} w_j, & \text{for } i = k+2, \ldots, n, \end{cases}$$

As explained in the foregoing, the Kautz' method requires a weight vector of which the binary value of the weight coefficients are expressed in n−1 bits, so that, in the case of high values for n a memory of large memory capacity is needed.

In accordance with the invention, the weighting coefficients $w_i$ are chosen such that they can be expressed using p-bit binary words for which p is smaller than n−1, and where 'zeroes' need to be added before or after, or both before and after the p-bit binary word so as to obtain the (n−1)-bit weight vector coefficient word.

The weight coefficients $w_i$ can be obtained using the following equation:

$$w_i = \begin{cases} 2^{i-1}, & \text{for } i = 1, \ldots, r+1 \\ \sum_{j=i-1-k}^{i-1} w_j & \text{for } i = r+2, \ldots, p \\ 2^{i-p-1} * \text{FLOOR}\left(2^{p-i+1} * \sum_{j=i-1-k}^{i-1} w_j\right), & \text{for } i = p+1, \ldots, n, \end{cases}$$

where $w_j=0$ for $j \leq 0$ and where the FLOOR of a value equals the largest integer value which is smaller than said value.

When using these weighting vector coefficients, channel words are obtained where at most r consecutive 'zeroes' occur at one and the same end, more specifically the trailing end, of the channel words. The trailing end of the channel words are defined as that end where the least significant bits of the channel word are positioned. This is realized by restricting the number of coefficients $w_i$ being equal to $2^{i-1}$ to r+1 coefficients. As a result, a concatenation of subsequent channel words will not lead to a violation of the k-constraint, as each n-bit channel word generated has at most k-r 'zeroes' at the leading end of the channel word. From the first formula $2^{i-1}$, it is clear that the weight coefficients $w_i$ have only one 'one' bit at a certain bit position in the weight coefficient, whereas the remaining bits of the weight coefficient are all 'zero'.

The other weight coefficients are obtained with the second and the third formula, which includes the floor function. The second formula defines the weight coefficients $w_{r+2}$ to $w_p$ and the third formula defines the weight coefficients $w_{p+1}$ to $w_n$.

From the second formula it is clear that each subsequent coefficient $w_i$ is obtained by summing the k previous coefficients $w_{i-1-k}$ to $w_{i-1}$, where those previous coefficients $w_i$ having an index number smaller than or equal to zero are set to zero. As a result, weight coefficients are obtained having a sequence of r+1 'ones' in r+1 neighbouring bit positions in the weight coefficient, whereas the remaining bits of the weight coefficient are all 'zero'.

It is further clear that, for deriving $w_i$ using the third formula, including the floor function, the sum term in the floor function is of the order of $2^{i-1}$. Dividing the sum term by $2^{i-1-p}$ will thus result in value which is of the order of $2^p$. This value can thus be expressed in p bits. Taking the floor and again multiplying by $2^{i-1-p}$ will result in weight coefficients that are expressed using p bit words and adding 'zeroes' before, or after, or both before and after the p-bit words.

If p equals k+2, the above equations for the weighting coefficients $w_i$ change into $$w_i = \begin{cases} 2^{i-1}, & \text{for } i = 1, \ldots, r+1 \\ (2^{r+1} - 1)2^{i-r-2}, & \text{for } i = r+2, \ldots, k+2, \\ ((2^{r+1} - 1)2^{k-r+1} + k + 2 - i)2^{i-k-3}, & \text{for } i = k+3, \ldots n. \end{cases}$$

In an 196-to-197 encoding method, where the sequence of channel words obtained satisfies the requirements k=7 and r=4, the weighting coefficients $w_i$ satisfy the following equation:

$$w_i = \begin{cases} 2^{i-1}, & \text{for } i = 1, \ldots, 5, \\ 31*2^{i-6}, & \text{for } i = 6, \ldots, 9, \\ (505 - i)2^{i-10}, & \text{for } i = 10, \ldots, 197. \end{cases}$$

As a result, the values for $w_i$ are as follows:

TABLE 2

| i | $w_i$ (decimal) | $w_i$ (binary) | |
|---|---|---|---|
| 1 | 1 | 0 ... | ... 0 |
| 2 | 2 | 0 ... | ... 10 |
| 3 | 4 | 0 ... | ... 100 |
| 4 | 8 | 0 ... | ... 1000 |
| 5 | 16 | 0 ... | ... 10000 |
| 6 | 31 | 0 ... | ... 11111 |
| 7 | 31 × 2 | 0 ... | ... 111110 |
| 8 | 31 × 4 | 0 ... | ... 1111100 |
| 9 | 31 × 8 | 0 ... | ... 11111000 |
| 10 | 495 | 0 ... | ... 111101101 |
| 11 | 494 × 2 | 0 ... | ... 111011000 |
| 12 | 493 × 4 | 0 ... | ... 1110101100 |
| 13 | 492 × 8 | 0 ... | ... 111101010000 |
| . | . | . | |
| . | . | . | |
| . | . | . | |
| 194 | 311 × $2^{184}$ | 000100110111 ... | ... 0 |
| 195 | 310 × $2^{185}$ | 00100110110 ... | ... 0 |
| 196 | 309 × $2^{186}$ | 0100110101 ... | ... 0 |
| 197 | 308 × $2^{187}$ | 100110100 ... | ... 0 |

The weight vector coefficients $w_i$ in the table 2 are in the form of 196 bits wide binary numbers.

Note that each $w_i$ can be obtained by generating a 9-bit binary word at the maximum and adding 'zeroes' before or after, or both before and after the 9-bit binary word. This for the reason that the weight coefficients $w_{10}$ to $w_{197}$ comprise a term (505-i), which equals the decimal value between 495 and 308. Those decimal values can be represented by a binary value of 9 bits, as can be seen in table 2, the right column.

From the table 2 it is clear that the weight coefficients $w_1$ to $w_5$ can even be obtained by generating 5-bit binary values '00001' to '10000' and adding 191 'zeroes' before these 5-bit binary values so as to obtain the 196-bit wide weight coefficients. It is even possible to generate an i-bit binary number for i equals 1 to 5, having a '1' bit as the most significant bit and having 'zero'bits for the lower significant bits (if present).

The weight coefficients $w_6$ to $w_9$ can be obtained by generating the decimal number '31', which is the 5-bit binary word '11111' and adding 191 'zeroes' before this word for i=6, adding 190 'zeroes' before and one 'zero'after the word for i=7, adding 189 'zeroes' before and two 'zeroes' after the word for i=8 and adding 188 'zeroes' before and three after the word for i=9.

The weight coefficients $w_{10}$ to $w_{197}$ are obtained by generating the 9-bit binary word corresponding to the decimal word '505-i', as explained above, and adding 197-i 'zeroes' before and i-10 'zeroes' after the 9-bit binary word.

FIG. 1 shows an embodiment of an encoding arrangement for encoding (n-1)-bit information words into n-bit channel words. The embodiment of FIG. 1 comprises an input terminal 1 for receiving a sequence of (n-1)-bit information words, a converter unit 2 for converting the (n-1)-bit information words into the n-bit channel words, and an output terminal 3 for supplying a sequence of n-bit channel words. The converter unit 2 comprises a calculation unit 5 and a weight coefficient generator 7. The weight coefficient generator 7 generates the weight coefficients $w_i$ at an output 11 in response to a value i supplied to an input 9, where i runs from 1 to n. The value i is also generated internally in the arrangement.

The conversion of an information word into a corresponding channel using the n weight vectors $w_i$ has been explained above, and is moreover well known in the prior art, so that no further discussion of this conversion will be given. The generation of the weight coefficients will be further explained with reference to FIG. 2, which discloses a further embodiment of the weight coefficient generator 7.

Figure 2:
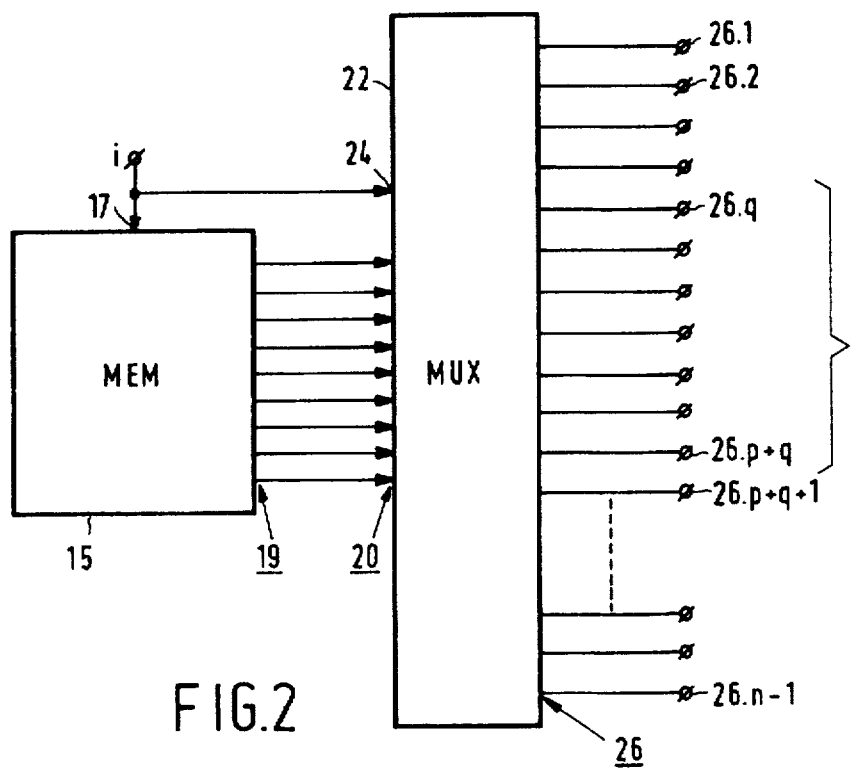
FIG. 2 is an embodiment of the weight coefficient generator in the encoding arrangement of FIG. 1.

The generator 7 of FIG. 2 comprises a memory 15 having a memory capacity for storing n p-bit binary words. In the example of table 2, this memory can have 197 9-bit words stored in it. In response to the value i supplied to an address input 17, the memory 15 supplies a p-bit binary word to a p-bit output 19. The p-bit binary words are supplied to a p-bit input 20 of a multiplexer 22, which has a (n-1)-bit output 26. In response to the value i supplied to an input 24, the multiplexer 22 multiplexes the p-bit binary word to p neighbouring output terminals 26.q to 26.p+q and connects the output terminals 26.1 to 26.q and 26.p+q+1 to 26.n-1 to a 'zero' value terminal (not shown).

In the embodiment of the coefficients of the table 2, it would suffice to have a 'one' terminal for connecting to the terminal 26.i, in the case that i runs from 1 to 5, to have the binary word (11111) stored in the memory 15 and connect the five output terminals of the output 19 of the memory 15 that have the word (11111) available, to the terminals 26.i–5 to 26.i–1 for i running from 6 to 9, and to have 188 9-bit words stored in the memory 15 and to supply those 9-bit words via the multiplexer 22 to the output terminals 26.i–9 to 26.i–1 for i running from 10 to 197.

Figure 3:
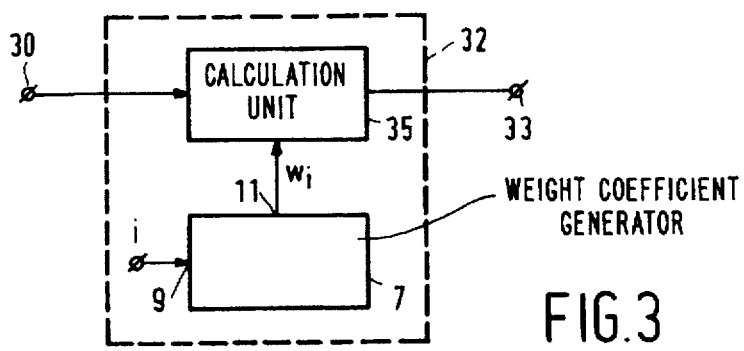
FIG. 3 is an embodiment of a decoding arrangement.

FIG. 3 shows an embodiment of a decoding arrangement for decoding n-bit channel words into (n-1)-bit information words. The embodiment of FIG. 3 comprises an input terminal 30 for receiving a sequence of n-bit channel words, a converter unit 32 for converting the n-bit channel words into the (n-1)-bit information words, and an output terminal 33 for supplying a sequence of (n-1)-bit information words. The converter unit 32 comprises a calculation unit 35 and a weight coefficient generator 7. The weight coefficient generator 7 generates the weight coefficients $w_i$ at an output 11 in response to a value i supplied to an input 9, where i runs from 1 to n. The value i is also generated internally in the arrangement. The weight coefficient generator 7 can be identical to the weight coefficient generator in the encoding arrangement of FIG. 2 so that it generates the same coefficients $w_i$ in response to the value i supplied to its input 9.

The conversion of a channel word into a corresponding information using the n weight vectors $w_i$ has been explained above, and is moreover well known in the prior art, so that no further discussion of this conversion will be given. The generation of the weight coefficients has been explained above, so that no further discussion of the generation of the weight coefficients will be given.

It should be noted that the p-bit words needed for generating the weight vector coefficients may be stored in a memory. This is not strictly necessary. It may be possible to generate the p-bit words using a calculation algorithm, such as the formulae given above, each time when a vector coefficient $w_i$ is needed for encoding or decoding.

What is claimed:

1. Encoding arrangement for encoding a sequence of (n−1)-bit information words into a sequence of n-bit channel words, the encoding arrangement comprises input means for receiving the information words, converter means for converting the (n−1)-bit information words into n-bit channel words, output means for supplying the channel words, the converter means comprising weight vector coefficient supply means for supplying a weight vector w, the weight vector having n weight vector coefficients $w_i$, where i is an integer running from 1 to n and the weight vector coefficients being in the form of (n−1)-bit binary words, calculation means for carrying out a calculation using an information word so as to obtain a channel word, which calculation is based on the following steps (a) set a running parameter j equal to n, (b) determine whether the value of the information word is larger than or equal to the weight vector coefficient $w_j$, if so, set the binary value in the bit position j of the channel word to 'zero' and subtract the value of the weight coefficient $w_j$ from the value of the information word so as to obtain a new value for the information word, if not, set the said binary value in the bit position to 'one', (c) repeat the step (b) n−1 times for each next lower value for j, $w_n$ being the weight vector coefficient having the largest value and weight vector coefficients having a next lower subscript j having a smaller value, wherein the weight vector coefficient supply means is adapted to supply p bits of a weight vector coefficient $w_i$, the remaining (n−1−p) bits of the (n−1)-bit weight vector coefficient word being 'zeroes' to be added before or after the p-bit binary word or before and after the p-bit binary word so as to obtain said weight vector coefficient, and that p is an integer larger than one and smaller than n−1.

2. Encoding arrangement as claimed in claim 1, wherein for generating a sequence of channel words having at most k consecutive 'zeroes' occur between subsequent 'ones' in the sequence, and at most r consecutive 'zeroes' occur at one and the same end of the channel words, the weighting coefficients $w_i$ satisfy the following equation:

$$w_i = \begin{cases} 2^{i-1}, & \text{for } i = 1, \ldots, r+1 \\ \sum_{j=i-1-k}^{i-1} w_j, & \text{for } i = r+2, \ldots, p, \\ 2^{i-p-1} * \text{FLOOR}\left(2^{p-i+1} * \sum_{j=i-1-k}^{i-1} w_j\right), & \text{for } i = p+1, \ldots, n, \end{cases}$$

where $w_j = 0$ for $j \leq 0$, and where the FLOOR of a value equals the largest integer value which is smaller than said value, and where r is smaller than k.

3. Encoding arrangement as claimed in claim 2, wherein p=k+2 and that the weighting coefficients $w_i$ satisfy the following equation:

$$w_i = \begin{cases} 2^{i-1}, & \text{for } i = 1, \ldots, r+1 \\ (2^{r+1} - 1)2^{i-r-2}, & \text{for } i = r+2, \ldots, k+2, \\ ((2^{r+1} - 1)2^{k-r+1} + k + 2 - i)2^{i-k-3}, & \text{for } i = k+3, \ldots, n. \end{cases}$$

4. Encoding arrangement as claimed in claim 3, wherein n=197, k=7 and r=4, and the weighting coefficients $w_i$ satisfy the following equation:

$$w_i = \begin{cases} 2^{i-1}, & \text{for } i = 1, \ldots, 5, \\ 31 * 2^{i-6}, & \text{for } i = 6, \ldots, 9, \\ (505 - i)2^{i-10}, & \text{for } i = 10, \ldots, 197. \end{cases}$$

5. Encoding arrangement as claimed in claim 2, wherein the channel words satisfy the requirement that at most r consecutive 'zeroes' occur at the trailing end of the channel words.

6. Decoding arrangement for decoding a sequence of n-bit channel words into a sequence of (n−1)-bit information words, the decoding arrangement comprises input means for receiving the channel words, converter means for converting the n-bit channel words into (n−1)-bit information words, output means for supplying the information words, the converter means comprising inverter means for inverting the channel words so as to obtain inverted channel words, weight vector supply means for supplying a weight vector w, the weight vector having n weight vector coefficients $w_i$, where i is an integer running from 1 to n, each weight vector coefficient $w_i$ being represented as a binary word, calculation means for carrying out a calculation using an inverted channel word so as to obtain an information word, which calculation is based on calculating an inner product $$I = \sum_{i=1}^{n} x_i * w_i$$

where $x_i$ is the i-th bit in the inverted channel word and I is the information word obtained from the calculation, and n and p are integer constants, wherein the weight vector coefficient supply means is adapted to supply p bits of a weight vector coefficient $w_i$, the remaining bits of the weight vector coefficient word being 'zeroes' to be added before or after the p-bit binary word or before and after the p-bit binary word, and that p is an integer larger than one and smaller than n−1.

7. Decoding arrangement as claimed in claim 6, wherein, for the sequence of channel words having at most k consecutive 'zeroes' occur between subsequent 'ones' in the sequence, and at most r consecutive 'zeroes' occur at one and the same end of the channel words, the weighting coefficients $w_i$ satisfy the following equation:

$$w_i = \begin{cases} 2^{i-1}, & \text{for } i = 1, \ldots, r+1 \\ \sum_{j=i-1-k}^{i-1} w_j, & \text{for } i = r+2, \ldots, p, \\ 2^{i-p-1} \cdot \text{FLOOR}\left( 2^{p-i+1} \cdot \sum_{j=i-1-k}^{i-1} w_j \right), & \text{for } i = p+2, \ldots, n, \end{cases}$$

where $w_j = 0$ for $j \leq 0$, and where the FLOOR of a value equals the largest integer value which is smaller than said value, and where r is smaller than k.

8. Decoding arrangement as claimed in claim 7, wherein p=k+2 and that the weighting coefficients $w_i$ satisfy the following equation:

$$w_i = \begin{cases} 2^{i-1}, & \text{for } i = 1, \ldots, r+1 \\ (2^{r+1}-1)2^{i-r-2}, & \text{for } i = r+2, \ldots, k+2, \\ ((2^{r+1}-1)2^{k-r+1}+k+2-i)2^{i-k-3}, & \text{for } i = k+3, \ldots n. \end{cases}$$

9. Decoding arrangement as claimed in claim 8, wherein n=197, k=7 and r=4, and that the weighting coefficients $w_i$ satisfy the following equation:

$$w_i = \begin{cases} 2^{i-1}, & \text{for } i = 1, \ldots, 5, \\ 31 * 2^{i-6}, & \text{for } i = 6, \ldots, 9, \\ (505-i) \cdot 2^{i-10}, & \text{for } i = 10, \ldots, 197. \end{cases}$$

10. Decoding arrangement as claimed in claim 7, wherein the channel words satisfy the requirement that at most r consecutive 'zeroes' occur at the trailing end of the channel words.

11. Encoding method for encoding a sequence of (n−1)-bit information words into a sequence of n-bit channel words, comprising the steps of:

receiving the information words, converting the (n−1)-bit information words into n-bit channel words;

supplying the channel words:

the converting step including:

supplying a weight vector w, the weight vector having n weight vector coefficients $w_i$; where i is an integer running from 1 to n and the weight vector coefficients being in the form of (n−1)-bit binary words; and carrying out a calculation using an information word so as to obtain a channel word; which calculation is based on the following steps:

(a) setting a running parameter j equal to n;

(b) determining whether the value of the information word is larger than or equal to the weight vector coefficient $w_j$, if so, set the binary value in the bit position j of the channel word to 'zero' and subtract the value of the weight coefficient $w_j$ from the value of the information word so as to obtain a new value for the information word, if not, set the said binary value to 'one'; and (c) repeating the step (b) n−1 times for each next lower value for j, $W_n$ being the weight vector coefficient having the largest value and weight vector coefficients having a next lower subscript j having a smaller value;

wherein the weight vector coefficient word includes p bits of a weight vector coefficient $w_i$, the remaining n−1−p bits of the (n−1)-bit weight vector coefficient word being 'zeroes' to be added before or after the p-bit binary word or before and after the p-bit binary word so as to obtain said weight vector coefficient, and p is an integer larger than one and smaller than n−1.

12. Encoding method as claimed in claim 11, wherein a sequence of channel words have at most k consecutive 'zeroes' occuring between subsequent 'ones' in the sequence, at most r consecutive 'zeroes' occuring at either end of the channel words, and the weighting coefficients $w_i$ satisfy the following equation:

$$w_i = \begin{cases} 2^{i-1}, & \text{for } i = 1, \ldots, r+1 \\ \sum_{j=i-1-k}^{i-1} w_j, & \text{for } i = r+2, \ldots p, \\ 2^{i-p-1} * \text{FLOOR}\left( 2^{p-i+1} * \sum_{j=i-1-k}^{i-1} w_j \right), & \text{for } i = p+1, \ldots, n, \end{cases}$$

where $w_j = 0$ for $j \leq 0$, and where the FLOOR of a value equals the largest integer value which is smaller than said value, and where r is smaller than k.

13. Encoding method as claimed in claim 13, wherein p=k+2 and the weighting coefficients $w_i$ satisfy the following equation:

$$w_i = \begin{cases} 2^{i-1}, & \text{for } i = 1, \ldots, r+1 \\ (2^{r+1}-1)2^{i-r-2}, & \text{for } i = r+2, \ldots, k+2, \\ ((2^{r+1}-1)2^{k-r+1}+k+2-i)2^{i-k-3}, & \text{for } i = k+3, \ldots n. \end{cases}$$

14. Encoding method as claimed in claim 14, wherein n=197, k=7 and r=4, and the weighting coefficients $w_i$ satisfy the following equation:

$$w_i = \begin{cases} 2^{i-1}, & \text{for } i = 1, \ldots, 5, \\ 31 * 2^{i-6}, & \text{for } i = 6, \ldots, 9, \\ (505-i)2^{i-10}, & \text{for } i = 10, \ldots, 197. \end{cases}$$

15. Encoding method as claimed in claim 13, wherein at most r consecutive 'zeroes' occur at the trailing end of the channel words.

16. Decoding method for decoding a sequence of n-bit channel words into a sequence of (n−1)-bit information words, comprising the steps of:

receiving the channel words:

converting the n-bit channel words into (n−1)-bit information words:

supplying the information words;

the converting step including:

inverting the channel words so as to obtain inverted channel words;

supplying a weight vector w, the weight vector having n weight vector coefficients $w_i$, where i is an integer running from 1 to n, each weight vector coefficient $w_i$ being represented as a binary word;

carrying out a calculation using an inverted channel word so as to obtain an information word, which calculation is based on calculating an inner product $$I = \sum_{i=1}^{n} x_i \cdot w_i$$

where $x_i$ is the i-th bit in the inverted channel word and I is the information word obtained from the calculation, and n and p are integer constants;

wherein the weight vector coefficient word includes p bits of a weight vector coefficient $w_i$, the remaining bits of the weight vector coefficient word being 'zeroes' to be added before or after the p-bit binary word or before and after the p-bit binary word, and p is an integer larger than one and smaller than n−1.

17. Decoding method as claimed in claim 12, wherein a sequence of channel words have at most k consecutive 'zeroes' occuring between subsequent 'ones' in the sequence, at most r consecutive 'zeroes' occuring at either end of the channel words, and the weighting coefficients $w_i$ satisfy the following equation:

$$w_i = \begin{cases} 2^{i-1}, & \text{for } i = 1, \ldots, r+1 \\ \sum_{j=i-1-k}^{i-1} w_j, & \text{for } i = r+2, \ldots, p, \\ 2^{i-p-1} * \text{FLOOR}\left(2^{p-i+1} * \sum_{j=i-1-k}^{i-1} w_j\right), & \text{for } i = p+2, \ldots, n, \end{cases}$$

where $w_j=0$ for $j \leq 0$, and where the FLOOR of a value equals the largest integer value which is smaller than said value, and where r is smaller than k.

18. Decoding method as claimed in claim 17, wherein p=k+2 and the weighting coefficients $w_i$ satisfy the following equation:

$$w_i = \begin{cases} 2^{i-1}, & \text{for } i = 1, \ldots, r+1 \\ (2^{r+1}-1)2^{i-r-2}, & \text{for } i = r+2, \ldots, k+2, \\ ((2^{r+1}-1)2^{k-r+1}+k+2-i)2^{i-k-3}, & \text{for } i = k+3, \ldots, n. \end{cases}$$

19. Decoding method as claimed in claim 18, wherein n=197, k=7 and r=4, and the weighting coefficients $w_i$ satisfy the following equation:

$$w_i = \begin{cases} 2^{i-1}, & \text{for } i = 1, \ldots, 5, \\ 31*2^{i-6}, & \text{for } i = 6, \ldots, 9, \\ (505-i)2^{i-10}, & \text{for } i = 10, \ldots, 197. \end{cases}$$

20. Decoding method as claimed in claim 12, wherein the channel words satisfy the requirement that at most r consecutive 'zeroes' occur at the trailing end of the channel words.

* * * * *